United States Patent
Yu et al.

(10) Patent No.: US 7,239,017 B1
(45) Date of Patent: Jul. 3, 2007

(54) LOW-K B-DOPED SIC COPPER DIFFUSION BARRIER FILMS

(75) Inventors: Yongsik Yu, Lake Oswego, OR (US);
Atul Gupta, Santa Clara, CA (US);
Karen Billington, Beaverton, OR (US);
Michael Carris, Tualatin, OR (US);
William Crew, Portland, OR (US);
Thomas W. Mountsier, San Jose, CA (US)

(73) Assignee: Novellus Systems, Inc., San Jose, CA (US)

( * ) Notice: Subject to any disclaimer, the term of this patent is extended or adjusted under 35 U.S.C. 154(b) by 171 days.

(21) Appl. No.: 10/915,117

(22) Filed: Aug. 9, 2004

Related U.S. Application Data

(63) Continuation-in-part of application No. 10/670,660, filed on Sep. 24, 2003, now Pat. No. 6,967,405.

(51) Int. Cl.
*H01L 23/48* (2006.01)

(52) U.S. Cl. ............... 257/751; 257/760; 257/E21.021; 438/627; 438/643; 438/653; 438/687

(58) Field of Classification Search .......... 257/751, 257/760, E21.021; 438/627, 643, 653, 687
See application file for complete search history.

(56) References Cited

U.S. PATENT DOCUMENTS

| | | | |
|---|---|---|---|
| 4,656,110 A * | 4/1987 | Yamazaki ................ 430/57.7 |
| 5,324,690 A | 6/1994 | Gelatos et al. |
| 5,654,208 A * | 8/1997 | Harris et al. ............... 438/522 |
| 5,739,579 A | 4/1998 | Chiang et al. |
| 6,045,877 A | 4/2000 | Gleason et al. |
| 6,100,587 A * | 8/2000 | Merchant et al. .......... 257/751 |
| 6,159,871 A | 12/2000 | Laboda et al. |
| 6,197,688 B1 | 3/2001 | Simpson |
| 6,352,945 B1 | 3/2002 | Matsuki et al. |
| 6,383,955 B1 | 5/2002 | Matsuki et al. |
| 6,399,484 B1 | 6/2002 | Yamasaki et al. |
| 6,417,092 B1 | 7/2002 | Jain et al. |
| 6,424,044 B1 | 7/2002 | Han et al. |
| 6,432,846 B1 | 8/2002 | Matsuki |
| 6,670,715 B2 * | 12/2003 | Yang et al. ............... 257/760 |
| 6,764,958 B1 | 7/2004 | Nemani et al. |
| 6,774,489 B2 | 8/2004 | Russell et al. |
| 6,790,767 B2 | 9/2004 | Lee |
| 6,790,788 B2 | 9/2004 | Li et al. |
| 6,855,645 B2 | 2/2005 | Tang et al. |

(Continued)

OTHER PUBLICATIONS

Yu, et al., "Novel Film for Copper Diffusion Barrier", Novellus Systems, Inc., U.S. Appl. No. 10/670,660, filed Sep. 24, 2003, pp. 1-26.

(Continued)

*Primary Examiner*—Michelle Estrada
*Assistant Examiner*—Jarrett J. Stark
(74) *Attorney, Agent, or Firm*—Beyer Weaver LLP

(57) ABSTRACT

The present invention provides a low dielectric constant copper diffusion barrier film composed, at least in part, of boron-doped silicon carbide suitable for use in a semiconductor device and methods for fabricating such a film. The copper diffusion barrier maintains a stable dielectric constant of less than 4.5 in the presence of atmospheric moisture.

7 Claims, 1 Drawing Sheet

U.S. PATENT DOCUMENTS

| | | | |
|---|---|---|---|
| 6,881,683 | B2 | 4/2005 | Matsuki et al. |
| 6,890,850 | B2 | 5/2005 | Lee et al. |
| 6,967,405 | B1 * | 11/2005 | Yu et al. ................. 257/751 |
| 7,064,088 | B2 | 6/2006 | Hyodo et al. |
| 7,163,889 | B2 * | 1/2007 | Yu et al. ................. 438/627 |
| 2003/0001275 | A1 | 1/2003 | Sambucetti et al. |
| 2003/0057553 | A1 | 3/2003 | Dela Rosa et al. |
| 2003/0068881 | A1 * | 4/2003 | Xia et al. ................. 438/637 |
| 2003/0082296 | A1 | 5/2003 | Elers et al. |
| 2003/0089992 | A1 | 5/2003 | Rathi et al. |
| 2003/0194496 | A1 | 10/2003 | Xu et al. |
| 2003/0232514 | A1 | 12/2003 | Kim et al. |
| 2004/0067308 | A1 * | 4/2004 | Zheng et al. .......... 427/249.15 |
| 2004/0084774 | A1 | 5/2004 | Li et al. |
| 2004/0113279 | A1 * | 6/2004 | Chen et al. ................. 257/774 |
| 2004/0124531 | A1 | 7/2004 | Venkatraman et al. |
| 2004/0207084 | A1 | 10/2004 | Hedrick et al. |
| 2005/0014361 | A1 | 1/2005 | Nguyen et al. |
| 2005/0042889 | A1 * | 2/2005 | Lee et al. ................. 438/780 |
| 2005/0202685 | A1 | 9/2005 | Huang et al. |
| 2005/0233555 | A1 | 10/2005 | Rajagopalan et al. |
| 2005/0236711 | A1 | 10/2005 | Wang et al. |
| 2005/0245071 | A1 | 11/2005 | Wu et al. |
| 2006/0019486 | A1 * | 1/2006 | Yu et al. ................. 438/628 |
| 2006/0110931 | A1 | 5/2006 | Fukazawa et al. |

OTHER PUBLICATIONS

Yu, et al., "Low-K SIC Copper Diffusion Barrier Films", Novellus Systems, Inc., U.S. Appl. No. 10/869,474, filed Jun. 15, 2004, pp. 1-25.

Masahiko Maeda, et al., "A Low-Permittivity Interconnection Using an SiBN Interlayer", Sep. 1989, IEEE Transactions on Electron Devices, vol. 36, No. 9.

Takashi Sugino, et al., "Synthesis of boron nitride film with low dielectric constant for its application to silicon ultralarge scale integrated semiconductors", 2001 Elsevier Science B.V., Diamond and Related Materials 1275-1379.

U.S. Office Action mailed Feb. 9, 2007 for U.S. Appl. No. 10/869,474.

U.S. Office Action mailed Sep. 6, 2006 for U.S. Appl. No. 10/869,474.

* cited by examiner

LOW-K B-DOPED SIC COPPER DIFFUSION BARRIER FILMS

CROSS-REFERENCE TO RELATED APPLICATION

This application is a continuation-in-part of application Ser. No. 10/670,660 filed Sep. 24, 2003 now U.S. Pat. No. 6,967,405 and titled NOVEL FILM FOR COPPER DIFFUSION BARRIER, the disclosure of which is incorporated by reference herein in its entirety and for all purposes.

BACKGROUND

This invention relates to low dielectric constant layers for use in various applications. The invention also relates to methods of forming low dielectric constant layers in a wide range of VLSI and ULSI fabrication operations.

As the features of microelectronic integrated circuits devices are reduced to smaller sizes, the electrical properties of the materials that constitute the devices will require change and improvement. One material that must be improved is the electrical insulator ("dielectric") used between the wires, metal lines, and other elements of the circuit. Without improvement in the insulator material, there will be increased problems due to capacitive effects such as coupling (crosstalk) and propagation delay. The speed at which future circuits will operate will be limited by RC delay in the interconnect.

These difficulties can be mitigated by preparing the circuit using an inter-layer dielectric ("ILD"), for example an inter-metal dielectric ("IMD"), having a dielectric constant that is as low as possible. The integration of Cu metal and IMD with a low dielectric constant continues to challenge the integrated circuit industry as device size and wiring dimensions are scaled down. Low dielectric constant (k) ("low-k"), insulators, with k significantly lower than that of presently used $SiO_2$ (3.9), are needed for reducing capacitive coupling and improving switching performance of future ULSI circuits. In this regard, the effective dielectric constant ($k_{eff}$) encountered by the signal in the interconnect structure is the most important parameter.

Cu/IMD integration schemes typically involve the incorporation of other materials along with the bulk inter-metal dielectric material, forming a stack. These other materials may include copper diffusion barrier, copper capping layer and hardmask (e.g., CMP and etch stop) materials needed to prevent copper poisoning of the bulk low-k dielectric, to protect the relatively soft low-k dielectric, and to facilitate the Damascene processing used in the device fabrication. These materials have a substantial impact on the effective k of the IMD stack. Thus, the IMD must meet the dual challenges of minimizing the effective k of the stack while providing material selectivity with the use of reduced k etch stop, barrier and capping materials.

Silicon nitride (SiN) provides a film having satisfactory properties as a copper diffusion barrier, but its dielectric constant is relatively high. A recently developed PECVD SiC dielectric barrier is a promising candidate to replace SiN in many copper barrier applications because of its relatively low dielectric constant (k<4.5). However, existing PECVD SiC technology has shown limitations in achieving dielectric constants lower than 4.5 while continuing to maintain other integration requirements relating to line to line leakage, via poisoning, etch selectivity, Cu hillock formation and atmospheric moisture uptake. Improved materials and processing are required.

SUMMARY OF THE INVENTION

The present invention is mainly directed to copper diffusion barrier films having low dielectric constants suitable for a variety of copper/inter-metal dielectric integration schemes, and methods of making and using them in semiconductor devices. Copper diffusion barrier films in accordance with the invention are composed of one or more layers of silicon carbide, at least one of the silicon carbide layers having a boron-doped composition as follows: $Si_xByCzHw$, wherein $0<x<0.5$, $0<y<0.85$, $0<z<0.75$ and $0<w<0.5$. The copper diffusion barrier films maintain an effective dielectric constant of below 4.5 in the presence of atmospheric moisture. Some such embodiments of the copper diffusion barrier film maintain a stable dielectric constant of between 3.0 and 4.5 in the presence of atmospheric moisture, for example 3.5.

The copper diffusion barrier films of the invention may be composed of a single boron-doped silicon carbide layer. According to this embodiment, a layer of boron-doped silicon carbide with a dielectric constant lower than 4.5 may be deposited as a copper diffusion barrier. Alternatively, the copper diffusion barrier films may be composed of multiple layers of silicon carbide having different compositions with a low effective dielectric constant, lower than 4.5 for example. The copper diffusion barrier film may have a thickness in the range of about 5 Å to 10000 Å.

In multi-layer copper diffusion barrier films of the invention, the composition of the layers may be tailored to provide additional functionality to the copper diffusion barrier film, and therefore to an IMD in which the copper diffusion barrier is incorporated. For example, undoped silicon carbide, nitrogen-doped silicon carbide and/or oxygen-doped silicon carbide layers may be incorporated into copper diffusion barrier film bi- or tri-layer stacks with boron-doped silicon carbide in accordance with the present invention to confer enhanced etch selectivity and moisture absorption blocking, respectively. In this way, the invention provides effective low-k IMD/Cu integration schemes.

Low-k copper diffusion barrier films in accordance with the invention may be formed by PECVD processes. In some embodiments, relatively high carbon (C) content organosilicon precursors not previously used in this application may be used. For example, conventional organisilicon precursors like tetramethylsilane may be used, or organisilicon precursors having at least 40% carbon (C), for example, between about 45 and 60% carbon (C) content may be used. Such high carbon content precursors (and their resulting barrier layer materials) will have a composition wherein the ratio of C to Si is greater than 2:1; or <3:1; or <4:1; or <5.1. Suitable high carbon organosilicon precursors may have at least 45%, 50% or 55% C and ratios of C:Si of at least 2:1 and as high as 5:1, or higher. In particular, high carbon organosilicon precursors such as ethynyltrimethylsilane, vinylphenylmethylsilane and phenyldimethylsilane, among others, may be used.

Other embodiments of the invention include a wholly or partially fabricated semiconductor device. The device includes a metal interconnect formed substantially of copper and a copper diffusion barrier adjacent the metal interconnect. The copper diffusion barrier is composed of one or more layers of silicon carbide, at least one of the silicon carbide layers having a composition as follows: $Si_xByCzHw$, wherein $0<x<0.5$, $0<y<0.85$, $0<z<0.75$ and $0<w<0.5$. The copper diffusion barrier films maintain an effective dielectric constant of below 4.5 in the presence of atmospheric moisture. In other such devices, the copper diffusion barrier films may be composed of multiple layers of silicon carbide having different compositions arranged to achieve effective low-k IMD/Cu integration schemes, as noted above.

Some aspects of the invention provide a method of forming at least a portion of a semiconductor device. The method includes the following operations: forming a trench in a first dielectric layer; forming a copper interconnect in the trench; and forming a copper diffusion barrier film on the copper interconnect, the copper diffusion barrier film comprising one or more layers of silicon carbide, at least one of the silicon carbide layers having a composition as follows: $Si_xByCzHw$, wherein $0<x<0.5$, $0<y<0.85$, $0<z<0.75$ and $0<w<0.5$. The copper diffusion barrier films maintain an effective dielectric constant of below 4.5 in the presence of atmospheric moisture.

The step of forming a copper diffusion barrier film involves a plasma-enhanced chemical vapor deposition ("PECVD") process using one or more organosilicon and boron precursor gases. The PECVD process may be performed in standard PECVD apparatus.

These and other features and advantages of the present invention will be described in more detail below with reference to the associated drawings.

DETAILED DESCRIPTION

Figure 1:
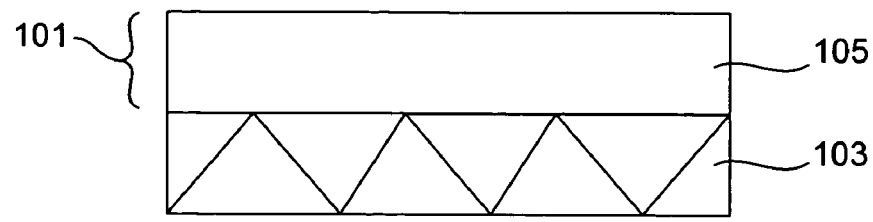
FIG. 1 illustrates a single layer copper diffusion barrier film in accordance with an embodiment of the present invention.

In the following description, the invention is presented in terms of certain specific compositions, configurations, and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

The present invention is mainly directed to copper diffusion barrier films having low dielectric constants suitable for a variety of copper/inter-metal dielectric integration schemes, and methods of making and using them in semiconductor devices. Copper diffusion barrier films in accordance with the invention are composed of one or more layers of silicon carbide, at least one of the silicon carbide layers having a boron-doped composition as follows: $Si_xByCzHw$, wherein $0<x<0.5$, $0<y<0.85$, $0<z<0.75$ and $0<w<0.5$. The copper diffusion barrier films maintain an effective dielectric constant of below 4.5 in the presence of atmospheric moisture. Some such embodiments of the copper diffusion barrier film maintain a stable dielectric constant of between 3.0 and 4.5 in the presence of atmospheric moisture, for example 3.5.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in particular apparatus. In short, a semiconductor device may exist at any state of manufacture that employs a method of this invention or possesses a structure of this invention.

The copper diffusion barrier films of the invention may be composed of a single boron-doped silicon carbide layer. Alternatively, the copper diffusion barrier films may be composed of multiple layers of silicon carbide having different compositions with a low effective dielectric constant, lower than 4.5 for example. In some embodiments, low-k copper diffusion barrier films may be formed by PECVD processes using novel organosilicon precursors not previously used in this application. In particular, carbon-rich organosilicon precursors such as ethynyltrimethylsilane, vinylphenylmethylsilane and phenyldimethylsilane, among others, may be used to achieve a low k barrier layer.

Barrier Films and Integration Schemes

Boron nitride films having a dielectric constant of approximately 2.7 have been prepared by atmospheric chemical vapor deposition ("CVD") at a high temperature. However, if exposed to air, these boron nitride films absorb moisture from the air and their dielectric constant increases substantially. Although boron-doped silicon nitride has a lower dielectric constant than pure silicon nitride, there are concerns that a $NH_3$-based process and/or a nitrogen containing plasma-based process such as SiBN could result in via poisoning and thus become unsuitable for use as a copper diffusion barrier for the next generation of semiconductor device.

The inventors have discovered that by carefully adjusting the stoichiometry between silicon carbide and boron carbide, plasma-deposited silicon boron carbide films having a dielectric constant of less than 4.5 can be formed. Surprisingly, these films have both good insulating properties and good moisture-blocking properties. These boron-doped silicon-carbide barrier films have a composition as follows: $Si_xByCzHw$, wherein $0<x<0.5$, $0<y<0.85$, $0<z<0.75$ and $0<w<0.5$.

The copper diffusion barrier films of the invention may be composed of a single boron-doped silicon carbide layer. According to this embodiment, a layer of boron-doped silicon carbide with a dielectric constant below 4.5 may be deposited, for example by plasma-enhanced chemical vapor deposition ("PECVD"), as a copper diffusion barrier. The copper diffusion barrier film may have a thickness in the range of about 5 Å to 10000 Å.

For example, during a PECVD process, diborane ($B_2H_6$) mixed 5%/95% with an inert carrier gas, such as a noble gas, e.g., argon or helium, or with hydrogen, may be used as a boron precursor, and an organosilicon precursor may used as a silicon and carbon source. Those of skill in the art will realize that other substances may be used as boron, silicon and carbon precursors. In some embodiments, trimethylborate or borane complexes such as dimethylamine borane, triethylamine borane or nido-pentaborane may be used as boron precursors. Conventional organiosilicon precursors such as tetramethylsilane may be used. Alternatively, carbon-rich organosilicon precursors such as ethynyltrimethylsilane (ETMS), vinylpheylmethylsilane (VPMS), phenyldimethylsilane (DMPS), tri-iso-proplysilane, 3-(trimethylsilyl)cyclopentene, vinylphenyldimethylsilane, vinyldimethylsilane may be used. These precursors have at least 40% carbon (C), for example, between about 45 and 60% C and produce SiC films having that same proportion of carbon which have a dielectric constant significantly lower than that of films formed with the conventional tetramethylsilane (4MS) precursor. These carbon-rich precursors are further described in commonly-assigned co-pending application Ser. No. 10/869,474 (Our Ref: NOVLP102 incorporated herein by reference for all purposes.

Barrier films in accordance with the invention are formed from these precursor materials in various configurations. The films will generally have at least one boron-doped layer with a composition as follows: $Si_xB_yC_zH_w$, wherein $0<x<0.5$, $0<y<0.85$, $0<z<0.75$ and $0<w<0.5$. FIG. 1 shows an example of a single layer boron-doped barrier film 101 disposed on the surface of a copper layer 103, such as a metal line or via, in order to provide some context for how the film would be disposed when used in a semiconductor device. The film is composed of a layer of boron-doped silicon carbide with a composition as follows: $Si_xB_yC_zH_w$, wherein $0<x<0.5$, $0<y<0.85$, $0<z<0.75$ and $0<w<0.5$ 105 on the copper 103. Such a film has a k lower than 4.5 in the presence of atmospheric moisture.

Moreover, the advantageous properties of these boron-doped SiC (BDC) materials can be leveraged in accordance with the present invention to provide low-k copper barrier films with enhanced performance. In this regard, BDC is an excellent copper barrier, blocks moisture absorption, and provides good etch selectivity, UDC is very low k and provides good etch selectivity, ODC layers block moisture absorption and NDC enhances etch selectivity. Amine free UDC and ODC processing can eliminate via poisoning caused by amine contamination of the low k material during damascene processing. These layers, one or more of which is boron-doped, may be combined in a variety of configurations to form multi-layer, multi-functional (e.g., copper barrier, etch and/or CMP stop, moisture barrier) SiC barrier films, depending on the particular integration scheme, in accordance with the present invention. The composition and configuration of the layers may be tailored to provide additional functionality to the SiC-based copper diffusion barrier film, and therefore to an IMD in which the copper diffusion barrier film is incorporated. In this way, the invention provides effective low-k IMD/Cu integration schemes. Some examples of these multi-layer barrier films are illustrated in FIGS. 2A and B.

Figure 2A:
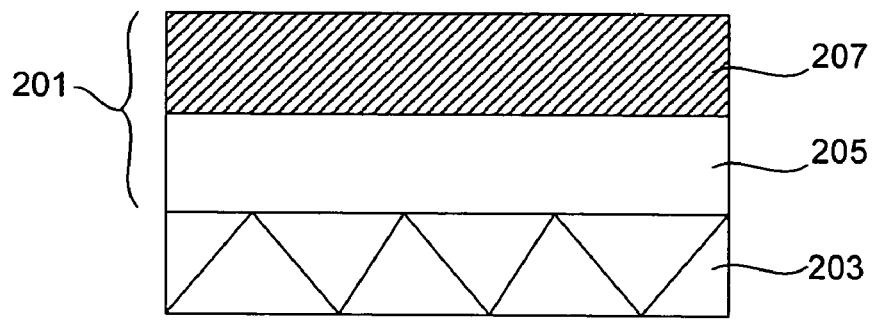
FIGS. 2A–B illustrate multi-layer configurations of copper diffusion barrier films in accordance with the present invention.

Referring to FIG. 2A, a BDC/ODC bi-layer copper diffusion barrier film in accordance with one embodiment of the present invention is shown. The barrier film 201 is shown disposed on the surface of a copper layer 203, such as a metal line or via, in order to provide some context for how the film would be disposed when used in a semiconductor device. The bi-layer film is composed of a layer of BDC 205 on the copper 203 and a layer of ODC 207 on the BDC. When the BDC layer 205 deposited between the freshly reduced Cu surface 203 and the ODC layer 207, it prevents copper migration, blocks moisture, provides good etch selectivity and prevents the freshly reduced Cu surface from being re-oxidized by the ODC layer and promotes adhesion of the SiC film to the copper. The ODC layer further blocks moisture absorption.

Since BDC and ODC films contain no amine (NH) source, the film will not cause any via poisoning during dual damascene integration. NDC films provide good etch selectivity to via/line dielectric films due to large compositional differences and good reliability due to stabilized Si—N and/or Si—C—N bonding. However, there are concerns that a $NH_3$-based process and/or a Nitrogen containing plasma based process such as NDC might result in via poisoning, and NDC films have shown higher k values than that of ODC, BDC or UDC films. It has been found that 200 Å or more of ODC or UDC layers are enough to prevent via poisoning no matter the thickness of the NDC layer, and the same is believed to be true for BDC.

Figure 2B:
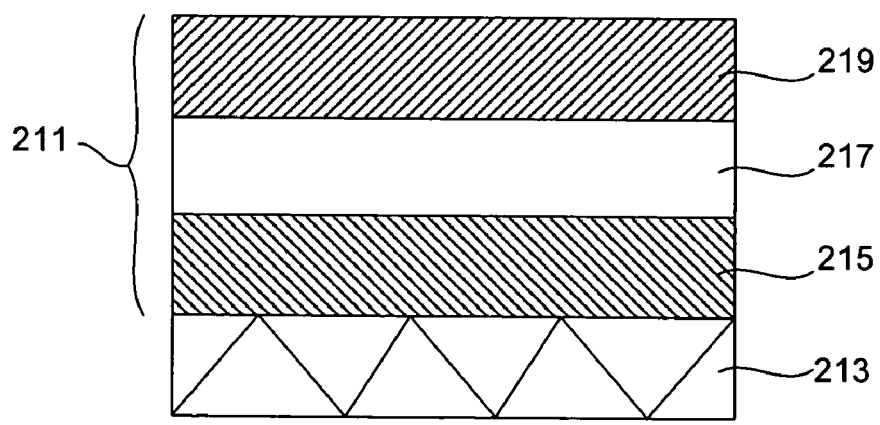

Referring the FIG. 2B, a BDC/NDC/ODC tri-layer copper diffusion barrier film in accordance with one embodiment of the present invention is shown. The tri-layer film 211 is composed of a layer of BDC 215 on the copper 213, a layer of NDC 217 on the BDC and a layer of ODC 219 on the NDC 217. According to this scheme, the BDC layer 215 provides an excellent copper barrier, the NDC layer 217 provides enhanced etch selectivity and the ODC layer 219 blocks moisture absorption.

In other embodiments (not shown) a carbon-rich UDC layer may be deposited as part of a bi- or tri-layer stack to confer low k on the entire stack.

The thickness of each of the stack layer is determined by the application needs. The relative thickness of the UDC, NDC, ODC and/or BDC layers determines the k and the etch selectivity of the entire stack ($k_{eff}$). As noted above, the thickness of the film may be from about 5 to 10000 Å, for example about 500 Å. The relative thickness of the film layers may vary depending on the requirements of the integration. The k values of BDC, NDC, UDC, and ODC are precursor dependent and can be tuned by the choice of precursor (e.g., carbon-rich organosilicon precursors to lower k) and the stack combinations according to the overall performance requirements.

The step of forming a copper diffusion barrier film involves a plasma-enhanced chemical vapor deposition ("PECVD") process conducted in a PECVD reactor. The structure and operation of PECVD reactors are well known in the art. Suitable reactors for implementation of the present invention include the Sequel and Vector systems available from Novellus Systems, Inc of San Jose, Calif. The PECVD process may be performed, for example, at temperatures in the range of 200 to 425 degrees Centigrade and at pressures in the range of 0.1 torr to 10 torr. The resulting film is preferably in the range of about 5 angstroms to 10000 Å thick. The process may be conducted at relatively low frequencies (e.g., 200 to 500 kHz) or at relatively high frequencies (e.g., at approximately 13.56 MHz). Preferably, the copper is pretreated (e.g., with ammonia and/or nitrogen gas and/or helium gas and/or hydrogen gas) before film deposition.

The PECVD process may involve flowing an organosilicon precursor gas at rates in the range of approximately 50 to 2000 standard cubic centimeters per minute and/or a liquid precursor at rates in the range of approximately 0.3–5.0 ml per minute, for example, 0.5–3.0 ml/min, and flowing carrier gas e.g., He and/or $H_2$ and/or Ar in the range of approximately 0 to 10000 standard cubic centimeters per minute, for an undoped SiC (UDC) layer. A boron-doped SiC may be formed by additionally flowing up to 14000 sccm of diborane or other boron source, such as trimethylborate or borane complexes such as dimethylamine borane, triethylamine borane or nido-pentaborane. An oxygen doped SiC (ODC) layer may be formed by additionally flowing up to 1000 sccm of $O_2$ and/or other oxygen source, such as $CO_2$. A nitrogen doped SiC (NDC) layer may be formed by additionally flowing up to 5000 sccm of nitrogen ($N_2$), ammonia ($NH_3$) or other nitrogen source. The PECVD process may be performed at temperatures in the range of approximately 200 to 425° C. (e.g., 350° C.), at pressures in the range of approximately 0.1 torr to 10 torr (for example about 4–8 torr, e.g., 8 torr), at high frequency RF power of about 500–3000 W and low frequency RF power at 0–1000 W, and/or at frequencies in the range of approximately 200 to 500 kHz. Alternatively, the PECVD process may be performed at a frequency of approximately 13.56 MHz or 27 MHz.

Some exemplary methods use a flow rate in the range of 2000 to 10000 standard cubic centimeters per minute (sccm) of the boron precursor and 50 to 2000 sccm for the organosilicon precursor. According to one such method, a diborane/argon mixture (5%/95%) is introduced at approximately 500 sccm, while a tetramethylsilane is introduced at approximately 800 sccm.

Further, the method may involve flowing the organosilicon precursor as a gas and/or liquid, depending on the precursor delivery method, at rates in the range of approximately 50 to 2000 standard cubic centimeters per minute (gas) and/or 0.3~5.0 ml per minute (liquid) and/or flowing carrier gas e.g., He and/or $H_2$ and/or Ar in the range of approximately 0 to 9000 standard cubic centimeters per minute. According to one such method, a diborane/argon mixture (5%/95%) at a flow rate of about 4500 sccm, and phenyldimethylsilane at a flow rate of about 0.5 ml per minute may be used.

The method may also include a pretreatment for removing copper oxide from the copper layer prior to forming the copper diffusion barrier on the copper layer. The pretreatment may involve exposing the copper layer to ammonia and/or hydrogen gas and/or helium and/or a nitrogen plasma. In some instances, a post-treatment may also be conducted, for example, exposing an oxygen-doped silicon carbide layer to $CO_2$ gas and/or $O_2$ plasma to condition the surface to optimally block moisture absorption.

Other embodiments of the invention include a wholly or partially fabricated semiconductor device. The device includes a metal interconnect formed substantially of copper and a copper diffusion barrier adjacent the metal interconnect. The copper diffusion barrier is formed of single or multi-layer silicon carbide films as described above. In some such devices, the copper diffusion barrier film may be composed of a single boron-doped silicon carbide layer. In other such devices, the copper diffusion barrier films may be composed of multiple layers of silicon carbide having different compositions arranged to achieve effective low-k IMD/Cu integration schemes, as noted above.

Some aspects of the invention provide a method of forming at least a portion of a semiconductor device according to well known dual damascene fabrication techniques, but using the high carbon-content organosilicon precursors and integration schemes according to the present invention. The method includes the following steps: forming a trench in a first dielectric layer; forming a copper interconnect on the in the trench (which generally involves depositing a metal diffusion barrier in the trench and depositing a copper seed layer on the metal diffusion barrier); and forming a copper diffusion barrier in accordance with the present invention on the copper interconnect.

CONCLUSION

Although the foregoing invention has been described in some detail for purposes of clarity of understanding, it will be apparent that certain changes and modifications may be practiced within the scope of the appended claims. It should be noted that there are many alternative ways of implementing both the process and compositions of the present invention. For example, while the invention has been described primarily in terms of preparing integrated circuits, it is not so limited. Accordingly, the present embodiments are to be considered as illustrative and not restrictive, and the invention is not to be limited to the details given herein, but may be modified within the scope and equivalents of the appended claims.

The entire disclosures of all references cited herein are incorporated by reference for all purposes.

The invention claimed is:

1. A semiconductor device, comprising:
  a metal interconnect formed substantially of copper; and
  a copper diffusion barrier film adjacent the metal interconnect, the film comprising a plurality of layers of doped silicon carbide forming a stack, the plurality of layers comprising a layer of boron-doped silicon-carbide and a layer of oxygen-doped silicon carbide, wherein the copper diffusion barrier film maintains an effective dielectric constant of less than 4.5 in the presence of atmospheric moisture.

2. The device of claim 1, wherein the stack is a bi-layer, comprising:
  a first layer of oxygen-doped silicon carbide; and
  a second layer of boron-doped silicon carbide adjacent the metal interconnect.

3. The device of claim 1 wherein the stack is a tri-layer, comprising:
  a first layer of oxygen-doped silicon carbide;
  a second layer of nitrogen-doped silicon carbide; and
  a third layer of boron-doped silicon carbide adjacent the metal interconnect.

4. The device of claim 1, wherein the layer of oxygen-doped silicon carbide is not the bottom layer of the stack disposed adjacent to the copper.

5. The device of claim 1, wherein the copper diffusion barrier film maintains an effective dielectric constant of between 3.0 and 4.5 in the presence of atmospheric moisture.

6. The device of claim 1, wherein the copper diffusion barrier film has a thickness in the range of 5 Å to 10000 Å.

7. The device of claim 1, wherein the layer of boron-doped silicon carbide of the copper diffusion barrier film has a composition as follows: $Si_xB_yC_zH_w$, wherein $0<x<0.5$, $0<y<0.85$, $0<z<0.75$ and $0<w<0.5$.

* * * * *